United States Patent
Banton et al.

(10) Patent No.: US 6,759,588 B1
(45) Date of Patent: Jul. 6, 2004

(54) CIRCUIT BOARD ASSEMBLY WITH A COMBINATION THERMAL, SHOCK, VIBRATION, AND/OR ELECTROMAGNETIC COMPATIBILITY COVER

(75) Inventors: Randall G. Banton, Lunenburg, MA (US); Don W. Blanchet, Burlington, MA (US); John R. Freeburn, Jr., Northborough, MA (US); Jason E. Bardo, Lowell, MA (US); A. Gregory Rocco, Jr., Carlisle, MA (US); Mike W. Gust, Westford, MA (US); Paul N. Zuidema, Marlborough, MA (US)

(73) Assignee: Mercury Computer Systems, Inc., Chelmsford, MA (US)

( * ) Notice: Subject to any disclaimer, the term of this patent is extended or adjusted under 35 U.S.C. 154(b) by 0 days.

(21) Appl. No.: 10/076,124

(22) Filed: Feb. 14, 2002

(51) Int. Cl.$^7$ ................................................ H05K 9/00
(52) U.S. Cl. .............................. 174/35 GC; 174/35 R; 361/752; 206/521
(58) Field of Search ......................... 174/35 R, 35 GC; 361/816, 818, 800, 752; 206/521

(56) References Cited

U.S. PATENT DOCUMENTS

| | | | |
|---|---|---|---|
| 4,672,509 A | 6/1987 | Speraw | |
| 4,694,555 A | 9/1987 | Russell et al. | 29/451 |
| 4,745,456 A | 5/1988 | Clemens | 357/79 |
| 4,751,872 A | 6/1988 | Lawson, Jr. | 98/1 |
| 4,768,286 A | 9/1988 | Ketcham | 29/841 |
| 4,770,242 A | 9/1988 | Daikoku et al. | |
| 4,855,870 A | 8/1989 | Russell et al. | 361/395 |
| 4,894,749 A | 1/1990 | Elko et al. | 361/383 |
| 4,924,352 A | 5/1990 | Septfons | 361/388 |
| 5,005,638 A | 4/1991 | Goth et al. | |
| 5,027,254 A | 6/1991 | Corfits et al. | |
| 5,109,981 A | 5/1992 | Maston, III et al. | 206/331 |

(List continued on next page.)

Primary Examiner—Hung V. Ngo
(74) Attorney, Agent, or Firm—David J. Powsner; Nutter, McClennon & Fish

(57) ABSTRACT

An improved circuit board assembly includes a cover or other member disposed adjacent to the substrate and, for example, spaced therefrom so as to define a plenum. Self-aligning heat sinks (or other heat dissipative elements) are spring-mounted (or otherwise resiliently mounted) to the cover and, thereby, placed in thermal contact with one or more of the circuit components. Flow-diverting elements are provided, e.g., so that the overall impedance of the board substantially matches that of one or more of the other circuit boards in a common chassis. The circuit board cover can be adapted to provide thermal and/or electromagnetic emission control, as well as shock and vibration. A connector arrangement provides electrical, mechanical and/or other operational coupling between the circuit board and a chassis regardless of whether the board is disposed in a slot on a first (e.g., upper) side of a source of cooling air for the chassis or on a second (e.g., lower) opposite side of that source. A circuit board can have one or two portions, each with an air flow inlet edge through which cooling air flow is received and an air flow outlet edge through which the air flow exits. An improved chassis for mounting of such circuit boards can have a center air inlet. It can also have a circuit-board insertion slot with a first air flow aperture disposed adjacent to a first edge of an inserted circuit board and a second apertures disposed adjacent to a second edge of the board. These apertures can be sized so that the impedance to air flow to a circuit board inserted in the slot substantially matches that to one or more other boards in the chassis. Such slots can form part of a card cage that is vacuum or dip brazed, or manufactured by an alternate process welding a cage of desired structural stiffness and air-flow/interference sealing. The circuit boards and chassis can include an air and/or electromagnetic interference (EMI) seal which forms as the circuit board is inserted into the chassis slot.

18 Claims, 7 Drawing Sheets

U.S. PATENT DOCUMENTS

| | | | |
|---|---|---|---|
| 5,170,323 A | 12/1992 | Perretta et al. | 361/386 |
| 5,210,680 A | 5/1993 | Scheibler | |
| 5,263,537 A | 11/1993 | Plucinski et al. | 165/97 |
| 5,280,411 A | 1/1994 | Dirks et al. | 361/707 |
| 5,313,099 A | 5/1994 | Tata et al. | 257/717 |
| 5,353,193 A | 10/1994 | Chia et al. | 361/704 |
| 5,397,919 A | 3/1995 | Tata et al. | 247/717 |
| 5,438,226 A | 8/1995 | Kuchta | 307/125 |
| 5,493,473 A | 2/1996 | Yanagi | |
| 5,617,296 A | 4/1997 | Melville et al. | |
| 5,632,021 A | 5/1997 | Jennings et al. | 395/309 |
| 5,667,870 A | 9/1997 | McCullough | 428/131 |
| 5,680,295 A | 10/1997 | Le et al. | |
| 5,895,884 A * | 4/1999 | Davidson | 174/35 R |
| 5,912,799 A | 6/1999 | Grouell et al. | |
| 5,923,532 A | 7/1999 | Nedved | |
| 5,930,487 A | 7/1999 | Story et al. | 395/300 |
| 5,940,266 A | 8/1999 | Hamilton et al. | |
| 5,940,288 A | 8/1999 | Kociecki | |
| 5,990,418 A * | 11/1999 | Bivona et al. | 174/52.4 |
| 6,100,468 A | 8/2000 | Niggl et al. | |
| 6,128,187 A | 10/2000 | Mimlitch, III et al. | 361/690 |
| 6,134,107 A | 10/2000 | Kerrigan et al. | 361/694 |
| 6,141,213 A | 10/2000 | Antonuccio et al. | 361/687 |
| 6,198,629 B1 | 3/2001 | Cannon et al. | |
| 6,230,541 B1 | 5/2001 | Mimlitch, III et al. | 72/379.2 |
| 6,239,984 B1 | 5/2001 | Koradia et al. | |
| 6,261,104 B1 | 7/2001 | Leman | |
| 6,268,567 B1 | 7/2001 | Brodsky et al. | 174/117 |
| 6,272,012 B1 | 8/2001 | Medin et al. | 361/690 |
| 6,274,821 B1 | 8/2001 | Echigo et al. | 174/255 |
| 6,280,317 B1 | 8/2001 | Przilas et al. | 454/184 |
| 6,288,898 B1 | 9/2001 | Johnson et al. | 361/687 |
| 6,292,361 B1 | 9/2001 | Johnson et al. | 361/687 |
| 6,293,331 B1 | 9/2001 | Wang | 165/80.3 |
| 6,297,958 B1 | 10/2001 | Lutz, Jr. | |
| 6,433,283 B2 | 8/2002 | Brodsky et al. | 174/117 |
| 6,452,796 B1 | 9/2002 | Roy | |
| 6,463,997 B1 | 10/2002 | Nicolai et al. | |
| 6,504,722 B2 | 1/2003 | Vittet et al. | |
| 6,544,311 B1 | 4/2003 | Walton et al. | |

* cited by examiner

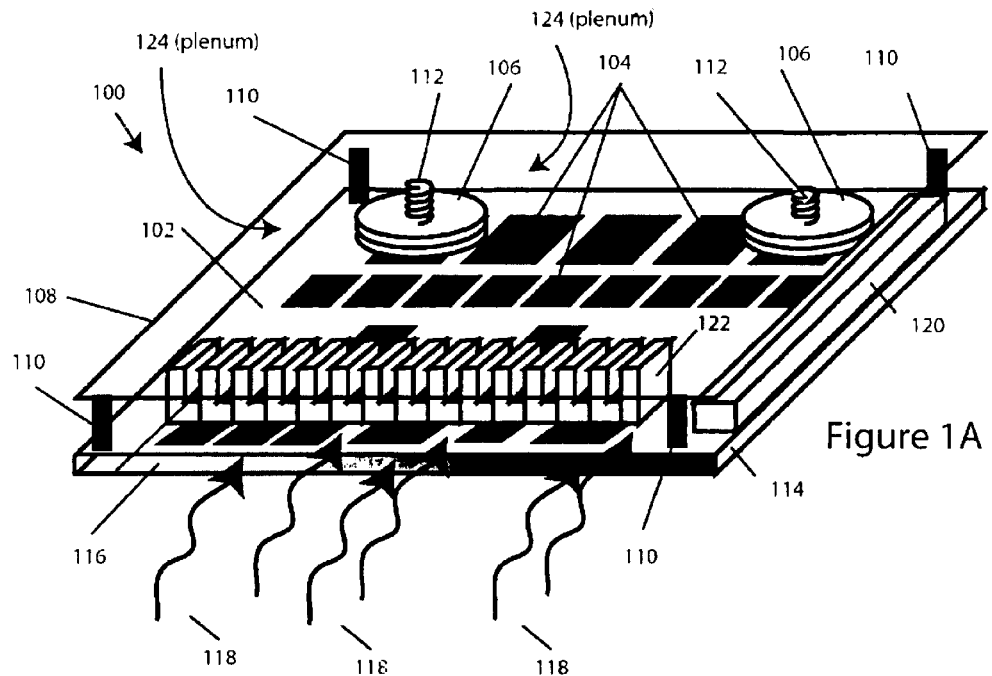
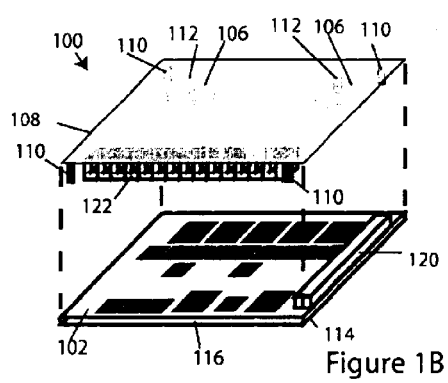
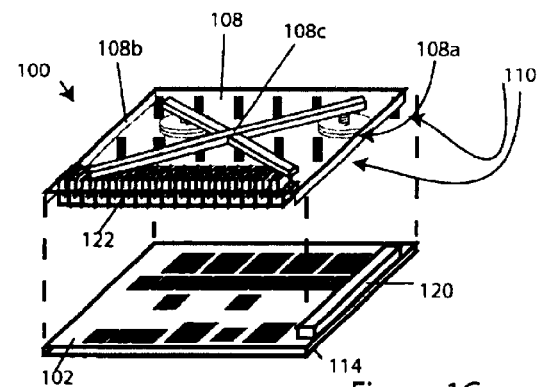
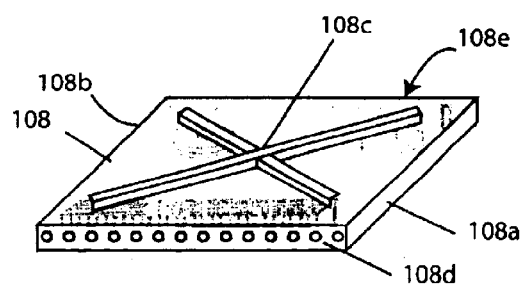

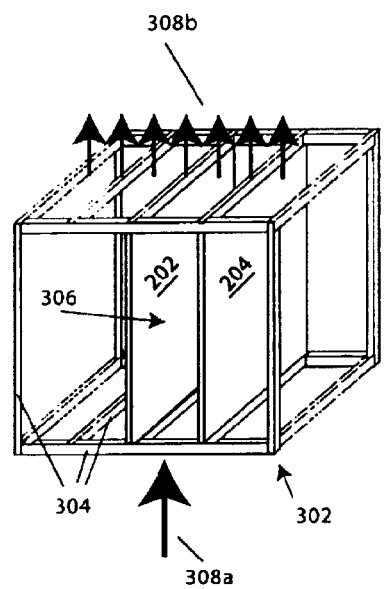
Figure 3A
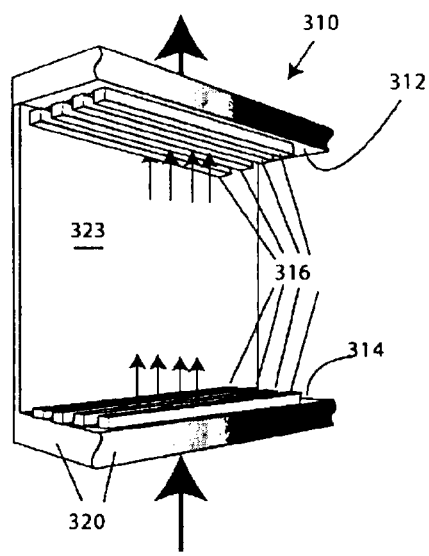
Figure 3B
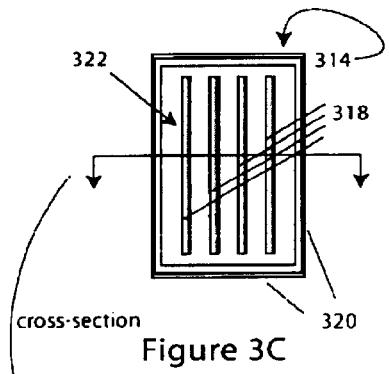
Figure 3C
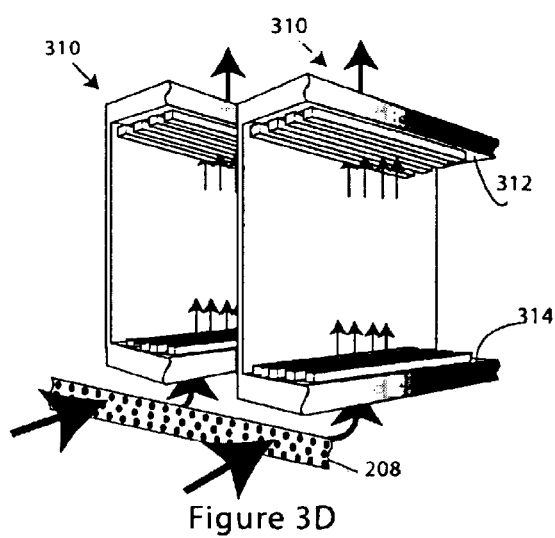
Figure 3D
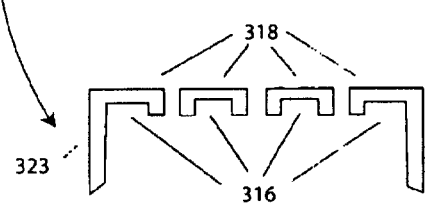

CIRCUIT BOARD ASSEMBLY WITH A COMBINATION THERMAL, SHOCK, VIBRATION, AND/OR ELECTROMAGNETIC COMPATIBILITY COVER

BACKGROUND OF THE INVENTION

The invention pertains to digital data processing and, more particularly to methods and apparatus for improving the processing power, ruggedness and/or longevity of digital data processing systems. The invention has application, by way of non-limiting example, in high-density embedded computer systems for image and signal processing applications such as radar, sonar, medical data acquisition and imaging, semiconductor device inspection and imaging, to name a few.

As processor speeds and circuit board densities increase, heat has become the limiting factor in computer design. Unless adequately dissipated, it can cause computers to run unpredictably or to crash. Excessive heat also substantially reduces component lifetimes. While this is merely annoying to the typical home or business user, it can prove catastrophic in mission critical applications, such as medical imaging, surveillance, and so forth.

The power requirements of reasonably sized individual computer circuit boards appear to be reaching asymptotic limits. Not so of the computers that house them. Manufacturers of at least high-end computer systems are pressured to include ever more circuitry in ever smaller chassis in order to meet customer throughput, redundancy and space requirements. The latter presents a real conundrum, however, since higher density board stacking reduces throughput and reliability, necessitating still more boards.

While cooling computer systems—and, particularly, for example, high density systems which now consume up to 3000 watts per cubic foot can be accomplished using low temperature fluids or special gasses, forced air-convection cooling remains the preferred mechanism. The dilemma of using this choice is compounded where inlet operating temperature requirements for some systems, for example, high-density embedded systems, is typically 50°–55° C., extending up to 70° C. in some cases.

Holding junction temperatures to acceptable levels for meeting the required reliability with these high inlet temperatures is at best difficult, and at worst impossible, using prior art techniques. This is likewise true oft maintaining basic component operation temperatures of 85°–100° C. Moreover, many of these systems are placed in close proximity to people, so the noise-levels must typically be at or below 65–68 dB(A) at 1 meter An object of this invention is to provide improved methods and apparatus for digital data processing.

A more particular object is to provide such methods and apparatus as improve the capacity, density, efficiency, ruggedness, and/or longevity of such digital data processing systems.

Another object of the invention is to provide such methods and apparatus as can be used with air-cooling and more particularly, for example, forced air-cooling—as well as with other heat dissipation techniques.

Still other objects of the invention are to provide such methods and apparatus as can be implemented at low cost using existing components, materials and/or fabrication techniques.

SUMMARY OF THE INVENTION

The foregoing objects are among those attained by the invention which provides, in one aspect, a circuit board assembly comprising a substrate with one or more circuit components mounted thereon. A cover or other member is disposed adjacent to the substrate and, for example, spaced therefrom so as to define a plenum. One or more heat sinks (or other heat dissipative elements) are spring-mounted (or otherwise resiliently mounted) to the cover and, thereby, placed in thermal contact with one or more of the circuit components.

The heat sinks are self-aligning, according to related aspects of the invention. Thus, they are disposed on the cover so that when it is coupled to the substrate (permanently, removably or otherwise) the heat sinks come into thermal contact with the respective circuit components. According to further related aspects of the invention, the cover is a substantially planar member, such as, for example, a cold plate or other thermal conductor, that is sized to match the footprint of the substrate.

Further aspects of the invention provide a circuit board or circuit board assembly of the type used, for example, with other circuit boards in a computer or other equipment chassis. A circuit board according to this aspect of the invention includes one or more flow-diverting elements that define, at least in part, the board's impedance to air flow in the chassis. The flow-diverting elements are adapted so that the overall impedance of the board substantially matches that of one or more of the other circuit boards.

According to related aspects of the invention, one or more of the floss-diverting elements are adapted to shape an air flow pattern within a plenum, for example, of the type established between the circuit board and its cover. Moreover, the flow-diverters can serve as heat sinks mounted, for example, to the substrate, the circuit components or (as discussed above) to the circuit board cover.

Still further aspects of the invention provide i circuit board assembly, e.g. of the types discussed above, in which cover is a substantially planar member with one or more structural elements that regulate shock and/or vibration in the cover and the circuit board. The structural elements may be rod-like or other elongate members, e.g., affixed to or incorporated into the planar member. Moreover, the structural members may be elongated heat sinks (or heat sinks of other shapes) that are coupled to the cover by spring-mounts, other resilient elements or otherwise.

In related aspects of the invention, the structural elements of the cover of a circuit board assembly as described above are adapted to control thermal and/or electromagnetic emission control, as swell as shock and vibration.

The invention provides, in yet other aspects, a circuit board for use in a chassis that has a plurality of board insertion slots. The board includes an air inlet edge through which cooling air flow is received and an air outlet edge through which the air flow exits. The edges fall, for example, at the ends of a plenum defined, e.g., between the circuit board substrate and a cover as described above. A connector arrangement provides electrical, mechanical and/or other operational coupling between the circuit board and the chassis regardless of whether the board is disposed in a slot on a first (e.g., upper) side of a source of cooling air for the chassis or on a second (e.g., lower) opposite side of that source.

According to related aspects of the invention, the connector arrangement includes first (e.g., upper) and second (e.g., lower) connectors. The first (e.g., upper) connector provides, for example, electrical coupling between the circuit board and the chassis when the circuit board is disposed in the slot on the first (e.g., upper) side of the source of cooling air. The second (e.g., lower) connector provides such coupling when the board is disposed in the second (e.g., lower) slot on the opposite side of that source.

Related aspects of the invention provide a digital data processor in a cabinet having, for example, a central air inlet and a chassis with board insertion slots disposed on opposite sides of that inlet. Circuit boards, as described above, disposed in the chassis have connector arrangements that provide operational coupling regardless of which slots the boards are inserted into.

Other aspects of the invention provide a circuit board having two parts, each with an air flow inlet edge through which cooling air floss is received and an air flow outlet edge through which the air flows exits. Each of these parts is disposed on opposing sides of a central source of cooling air for the circuit board. That source, according to related aspects of the invention, is an air inlet incorporated into a panel that provides Ana of mechanical protection and electromagnetic interference (EMI) protection when the circuit board is operationally coupled in a slot in a chassis. The inlet can be disposed centrally on the panel (e.g., between the first (or upper) and second (or lower) board parts) and can be aligned with a corresponding air inlet on the chassis cover of a digital data processor into which the board is inserted.

Yet still other aspects of the invention provide an improved chassis of the type having slots for slideable insertion of circuit boards. Each slot, according to this aspect of the invention, has a first air flow aperture disposed adjacent to a first edge of an inserted circuit board and a second aperture adjacent to a second edge of the board. The first air aperture is an air flow source; the second is an air flow exit. These apertures can be disposed, for example, oil opposite ends of plenum in the circuit board, e.g., whether defined by a cold plate on which the board substrate is mounted or by a cover to which the board is coupled.

According to related aspects of the invention, the aforementioned chassis includes a cabinet with an air flows inlet. It provides to the first air flow aperture of the slots cooling air flow drawn from an environment outside the cabinet. Air flow exiting the slots second air flow apertures, conversely, can he directed to that outside environment or to another region within the covered chassis.

Still further related aspects of the invention provide a chassis as described above in which the first and second apertures are sized so that the impedance to air flow to the circuit board inserted in tile slot substantially matches that to one or more other boards in the chassis. Yet still further related aspects provide a card cage having card insertion slots as described above that is vacuum or dip brazed, or by alternate process yielding a cage of sufficient structural stillness and air-flow/interference sealing.

The invention provides, in still further aspects, circuit boards and chassis as described above in which an air and/or electromagnetic interference (EMI) seal is provided between each circuit board and the chassis slot into which it is inserted.

Further aspects of the invention provide digital data processors, e.g., in closed chassis or cabinets having centrally disposed air inlet grills, with card cages as described above and with circuit boards and circuit board assemblies, also as described above, in those chassis. Such digital data processors, as well as the assemblies of which they are made, provide for improved capacity, density, efficiency, ruggedness, and/or longevity or components that provide digital data processing functions. They can be used with air-cooling and more particularly, for example, forced air-cooling—as well as with other heat dissipation techniques. Moreover, they can be implemented at low cost using existing components, materials and/or fabrication techniques.

These and other aspects of the invention are evident in the description that to follows and in the attached drawings.

BRIEF DESCRIPTION OF THE DRAWINGS

A more complete understanding of the invention may be attained by reference to the drawings, in which:

FIGS. 1A–1B depicts a circuit board assembly according to one practice of the invention having multiple self-aligning heat dissipative elements (e.g., heat sinks) mounted by rings (or other resilient elements) on a cover;

FIGS. 1C–1D depict circuit board assemblies according to the invention with combination thermal, shock, vibration, and/or electromagnetic compatibility (EMC) cover;

FIG. 3A depicts a card cage for use with circuit board assemblies according to the invention;

FIGS. 3B–3D depict a card-cage according to the invention with integrated control and shaping of air resistance curve for multiple plenum chambers;

DETAILED DESCRIPTION OF THE ILLUSTRATED EMBODIMENT

Figure 2A:
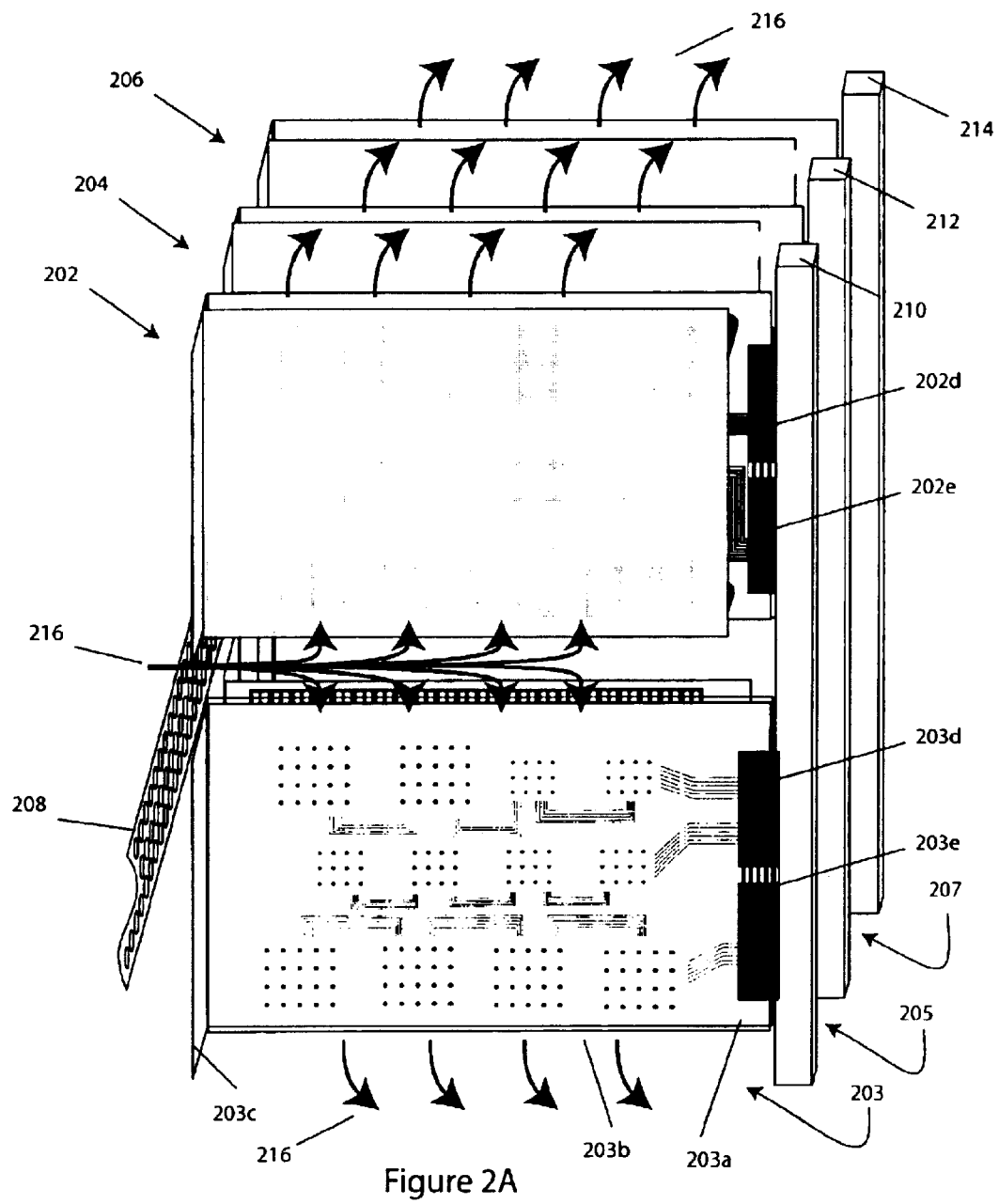
FIG. 2A depicts a circuit board assembly according to the invention for use in a center inlet chassis.

Circuit Board Assembly with Integrated Air Plenum Chamber using Self-Aligning Heat Sinks Figs. 1A depicts a circuit board assembly 100 according to the invention with an integrated plenum and with self-aligning heat sinks or other thermal dissipative elements (collectively, "heat sinks"). Illustrated assembly has a substrate 102 with chips and/or other circuit components (collectively, "components") 104 disposed thereon. Heat sinks 106, 122 are disposed on a cover 108 that is removably affixed to substrate 102 via mounts 110. As illustrated, for example, with respect to heat sinks 106, 122, these may be disposed on springs 112 or other resilient elements such that, as the cover is placed on the circuit board, the sinks come into thermal contact with the components 104—with controlled positive pressure applied by the springs (or other resilient elements) to maintain that contact. Illustrated assembly 100 also includes a connector or connector array 120 through which the assembly achieves operational coupling, e.g., electrical, optical and/or mechanical coupling with a chassis or other structure in which the assembly is installed.

In reading the discussion that follows, those skilled in the art will appreciate that the illustrated use of spring-mounted (or other resiliently-mounted) heat sinks differs from the prior art practice of permanently mounting heat sinks directly on the substrate 102 or components 104, and of the prior art practice of fabricating a monolithic heat sink that covers the entire board and that is machined to fit each component thereon. Of course, however, the illustrated assembly may utilize heat sinks in accord with these prior art techniques, as well.

Illustrated substrate 102 comprises a conventional printed circuit board substrate sized in accord with well known IEEE 1101.x or "Eurocard" 3U, 6U, 9U standards, or other standard or non-standard form factors known in the art. The substrate comprises plastic, resin, ceramic, metal and/or other material suitable for supporting components 104 and providing electrical coupling, through conductive vias or otherwise, therebetween. According to some practices of the invention, substrate 102 is formed of, or mounted on, a "cold plate" 114 or other thermally conductive material (such as, by way of example, copper, brass, aluminum, other metals, composites or compounds) suitable for drawing heat away from the underside (or "solder side") of the substrate 102 or mounted components 104. Illustrated cold plate 114 is of the variety having a plenum 116 (or plural plenums) through which cooling air (represented by arrows 118) can flow. Solid cold plates or those without plenums (whether or not solid), or those of still other configurations, may be used in addition or instead.

Components 104 are selected and operated in accord with the digital data processing function of the circuit board assembly 100. This may be as a motherboard, compressor card, signal processing board, memory board, interconnect fabric, input/output board, and so forth. Selection, configuration and operation are per convention in the art, as modified in accord with the teachings hereof for thermal, shock, vibration, and/or electromagnetic compatibility (EMC) control.

In preferred embodiments, the components 104 are mated with the substrate 102 in the conventional manner. As noted above, that substrate is formed of and/or mounted to the cold plate 114 thereby, providing a large path of heat dissipation and spreading. The internal thickness or structure of the substrate 102 and/or cold-plate 114 are machined or otherwise fabricated based on the mix of component densities and power levels in each region of the substrate 102. Thus, for example, the plate thickness in regions beneath processors and other high-temperature components is adjusted to rapidly dissipate heal to the other regions. As discussed below, that heat is preferably removed via air flow through the cold plate plenum 116, which can form pan of a leak-free air channel—ensuring the heat will be removed even more quickly by making efficient use of the available air flow.

Illustrated cover 108 is a substantially planar (or otherwise-shaped) member removably (or otherwise) mounted on substrate 102 defining an integrated plenum 124 for cooling air 118 on the topside (or "component side") of the substrate. In this illustrated embodiment, this is a metal cover of solid, hollow or other construction having a substantially like footprint (i.e., size and shape) as substrate 102—downsized, upsized or otherwise modified as necessary to accommodate use or placement of the assembly 100 in a chassis or otherwise. Though constructed of metal in the illustrated embodiment, in other embodiments it may comprise other materials, thermally conductive or otherwise.

Mounts 110 can be screw-mounts or other structures suitable for affixing cover 108 to substrate 102, directly, via rotation or otherwise. Such affixation can be permanent, though, preferably provides for detachment or at least partial removal (e.g., via rotation) of the cover, e.g., for inspection and/or repair of the components.

Illustrated heat sinks 106, 122 are thermal conductive and/or dissipative elements of the type known in the art. These may be passive elements (e.g., such as cold plates or fins) fabricated of copper, brass, aluminum or other metals, composites or compounds or active elements (such as microfans). Though disk-shaped and stepped heat sinks are shown in the drawing, it will be appreciated that sinks of any other shape or configuration may be used in addition or instead. These heat-sinks may be of commodity or custom design. As in the case of elements 106, a single heat sink may be provided for each component 104 expected to generate substantial heat during system operation or susceptible to failure or degradation on account of such heat. Alternatively, a single heat sink may be provided for multiple components, as in the case of heat sink 122.

Regardless, the heat sink s 106, 122 are provided with a surface suitable for thermal coupling with its respective component(s) 104. This may comprise a smooth, rigid or knobbly surface, or otherwise. The surfaces of sinks 106 may also be contoured, as desired, to insure more accurate registration between each sink 106 and its corresponding component 104. A thermal interface material can also be combined with or applied to the sinks to facilitate registration and/or thermal coupling.

Through the illustrated embodiment contemplates thermal coupling via surface contact between the lower surfaces of heat sinks 106 and the upper surfaces of the respective components 104, other contact/coupling may be provided instead or in addition. In the case of microfans, such an interface may not be necessary, though suitable means may be provided for directing the action (e.g., suction or blowing) of such element to the respective component 104.

Illustrated heat sinks 106, 122 are disposed on springs 112 such that, as the cover is put into place the sinks come into thermal contact with their respective components 104, thereby facilitating manufacture of the assembly 100. Heat sink 122 may, too, be spring-mounted, though this is not shown in the drawing. In the illustrated embodiment, the springs themselves are affixed to the cover (and, in turn, the sinks mounted on their respective springs) so as to insure that the sinks 106. 122 are self-aligning or will otherwise maintain alignment with their respective components 104 as the cover 108 is affixed into place on substrate 102 and, preferably, through repeated removals and reaffixations of the cover on the substrate. Affixation of the springs 112 to the cover 108 (and, in turn, affixation of the heat sinks 106 to the springs) may be via screws, adhesives, friction fit, integral molding, or otherwise, although since the springs and mounts may be an EMI ground bonded to the cover, appropriate materials must be selected.

One or more springs can be provided for each heat sink, with the characteristics of each spring selected to meet operational constraints. These springs maintain a load on the heat sink and component interface without exceeding the maximum load of the component dies, further stability and greater assurance of thermal contact between the sinks 106 and components 104 may be gained through use of more springs of greater spring constant k. Alternatively, or in addition, springs of larger cross-section surface area may be employed. Though springs are used in the preferred embodiment, those skilled in the art will appreciate that mechanisms and materials exhibiting spring-like qualities—e.g., of resilience and of applying a positive controlled pressure between the heat sinks and the components in which they are in thermal contact—may be used instead. Such mechanisms and materials are referred to throughout this document as "resilient elements," and components mounted thereon are referred to as "resiliently-mounted."

As discussed below, in addition to drawing heat away from the substrate 102, cold plate 114 and/or circuit components 104, the heat sinks may shape the air flow patterns within plenum 124, e.g., so as to divert air flow to/from components 104 or regions of the board requiring greater/less air flow. Other features built directly into cover 108 can also shape the air flow patterns.

A further appreciation of the construction of circuit board assembly 100 may be had through reference to FIG. 1B, which shows the assembly in a partially disassembled form. As illustrated, attached to cover 108 are heat sinks 106, 122, the former via springs 112 (or other resilient elements). Conversely, mounted on substrate 102 are components 104. Though shown as affixed to cover 108, mounts 110 may be affixed to that to substrate 102, or otherwise. Conversely, while circuit board connector or connector array 120 can be mounted on cover 108, in the illustrated embodiment, they are affixed to the substrate 102, the connector and substrate attached via a cable, circuit card, or other means.

Circuit Board Assembly with Integrated Shaping and Control of Flow Resistance Curve Circuit board assembly 100 is intended for insertion in a covered chassis or "cabinet" along with one or more other circuit board assemblies, though, those skilled in the art will appreciate that the features discussed herein are applicable in other environments as well (e.g., those including no chassis and/or other assemblies). The assembly 100 can, according to one practice of the invention, include integrated features, as detailed below, for control of the assembly's air flow resistance curve and for shaping of air flow patterns within plenum 124, e.g., so as to divert air flow to/from components 104 or regions of the board requiring greater/less air flow.

Referring, again, to FIG. 1A, in the illustrated embodiment, impedance presented by assembly 100 to air flows 118 in such a chassis otherwise in the environment surrounding the board (e.g., it not disposed in a chassis is preferably matched with other circuit board assemblies in the cabinet. This assures, with a known overall air flow, that board 100 will receive a predictable air flow, regardless of what other boards are present at any given time and regardless of where (e.g., in which slots) those other boards are positioned.

In alternate embodiments, the impedance presented by assembly 100 to air flows 118 is sized in relation to those of the other boards, though, is not necessarily set to match them. Thus, by way of example, an assembly 100 may be configured with 10%–80% less (or greater) impedance than the other circuit board assemblies, depending on the power dissipation and number of components 104 carried it. For example, the mechanisms discussed below may be employed to increase the impedance of a board that has fewer components and that would otherwise have less impedance, say, than boards with more components. This can be useful in environments where a single cabinet is expected to house boards of two or more types, e.g., some requiring greater air flow.

In the illustrated embodiment, the impedance presented by assembly 100 to air flows 118 can be managed by adjusting the thickness, the features on the inside surface, and the size of cover 108, substrate 102 and/or cold plate 114 (if any) on which the substrate is mounted or of which it is formed, as well as by the relative spacing of these structures, the placement and sizing of components 104, heat sinks 106, and mounts 110. This is likewise the of the air flow patterns within the plenum 116: and in the 124 plenum defined between cover 108 and substrate 102 of circuit board assembly 100.

According to one practice of the invention, cover 108 is preferably dimensioned and spaced-apart from substrate 102 such that assembly 100 presents an impedance to air flows 118 somewhat below a target value that is selected to substantially match (e.g., to tall within 0%–2%, 0%–5%, 0%–10% or 0%–20% or other ranges, depending on operation requirements) or be sized in relation to that of other boards in the cabinet. That impedance is then "finely tuned" to the target and air flow patterns within plenum 124 adjusted by inclusion of air-flow diverting structures mounted on substrate 102, cover 108, or otherwise a within (or adjacent to) the plenum 124 and 116.

Heat sink 122 (which otherwise serves to draw heat from components 104) serves this purpose in the illustrated embodiment, though in other embodiments other structures (heat dissipative or otherwise) may be used, in addition or instead. To this end, the sink 122 or other flow-diverting structures are placed at or near an air flow inlet of plenum 124. Other embodiments may, instead or in addition, incorporate such sinks or other structures at or near an outlet of the plenum (e.g., to create more pressure drop within the plenum 124) and/or at other locations within the plenum. Examples of the latter include heat sinks 106. A cover that utilizes other structures—particularly, apertured endpieces 108d, 108e—at the inlet and outlet for purposes of tuning impedance and/or diverting airflow within the plenum is shown in FIG. ID. These tuned apertured end-pieces can form part of and stay with the circuit board assembly 100 and, thus, for example, the assembly 100 can be removed from a chassis and replaced with a different such assembly (e.g., having a different tuned impedance) without substantial changes to the card cage or chassis.

Regardless, the heat sinks or other the flow diverting structures are positioned, sized and shaped to tune the overall air-flow impedance of the assembly 100 to the target value, as well as to effect a desired flow pattern within plenum 124 (e.g., so as to divert air flow to/from components 104 or regions of the board requiring greater/less air flow). By one practice of the invention, this is done empirically, faith measurements of air-flow impedance and air-flow being determined using an air-flow chamber and an air-flow meter. Alternatively, or in addition, positioning, sizing and shaping of the sinks or other flow-diverting structures can be performed with a computer aided design modeling program, or otherwise.

Circuit Board Assembly with a Combination Thermal, Shock, Vibration, and/or Electromagnetic Compatibility Cover As evident in the discussion above and, further, in that which follows, circuit board assembly cover 108 is configured to provide thermal, shock, vibration, and/or electromagnetic compatibility (EMC) control through use of mounts 110, heat sinks 106, 122 and/or further structural mean hers that are incorporated into cover 108.

Referring to FIG. 1C, supports 110 are fabricated into cover 108 or affixed thereto by adhesives, rivets, screws or other affixation means known in the art. The number, dimensions, and structure of the supports 110, as well as the materials out of which they are fabricated, are selected to regulate shock and/or vibration in the assembly 100 in accord with the layout, rigidity and other characteristics of the board (e.g., substrate 102 and cold plate 114, if any) with which the cover 108 is used and of the expected operational environment of the assembly 100. By one practice of the invention, such selection is performed empirically, while in other embodiments it is performed using computer aided design modeling program, or otherwise, of the type known in the art.

In the illustrated embodiment the supports 110 are annular metal peg-like structures formed integrally with the cover 108 and suitable for screw-mounting cover 108 to the substrate 102 and/or cold plate. Two rows of those supports 110 are provided, as shown, consistent with the layout of the components 104 on the substrate 102. Again, other embodiments may use supports of other shapes and configurations, e.g., consistent with the discussion herein, chosen either for mounting air flow shaping and/or EMI considerations. Likewise, support materials other than metal may be used, such as, plastics, elastomers, and/or compound structures (such as air-filled plastic "balloons")—although a metallic material would typically be chosen for grounding and EMI reasons.

In addition to controlling shock and/or vibration, supports 110 can be arranged to control electromagnetic emission from the assembly 100, e.g., by spacing them appropriately in selected regions of the board. Thus, for example, the supports can be formed into supportive endpieces 108a, 108b of the cover 108, blocking emissions from the respective regions of the board and providing further shock and/or vibration control. If placed in thermal communication with substrate 102 and/or cold plate 114, metal and other thermally conductive supports 108a, 108b, 110 (collectively. 110) can, moreover, draw heat away from the board and its components 104. Likewise, the tuned apertured end-pieces 108d and 108e can also serve to control electromagnetic emission from the respective regions of the board and/or to provide further shock and/or vibration control. In addition, localized EMI containment "boxes" can be formed in cover 108 to surround components on substrate 102.

Incorporation and/or affixation of heat sinks 106, 122 to cover 108 provides further control of shock, vibration, temperature and electromagnetic emission. For example, when the cover 108 is mounted on substrate 102, the heat sinks flush with the cover 108, as well as with the component in which they are in thermal contact, thus, providing reinforcement against shock and/or vibration.

In addition to airflow diversion, as discussed above, the sinks 106, 122 are placed to optimize drawing excess heat from the substrate 102 and for directly from components 104. Consistent with the principles above, the dimensions and configuration heat sinks 106, 122, as well as the materials out of they are fabricated, are selected to regulate shock vibration, temperature and electromagnetic emission in accord with the characteristics of the cover, the board (e.g., substrate 102 and/or cold plate 114) and the expected operation environment of the assembly 100. In the illustrate embodiment, such selection is performed empirically, while in other embodiments it is performed using computer aided design modelling programs, or otherwise.

Illustrated cover utilizes further structural members 108c for additional shock and vibration regulation. These add structural rigidity to the cover 108 and may be formed integrally with or affixed to it. A cross-shaped member 108c is shown in FIG. 1C, those skilled in the art will appreciate that any manner of structures may be formed with or affixed to cover 108 in order to enhance shock and vibration regulation. Examples include individual rod-like members (e.g., of the type that make up the cross-shaped member 108c) and/or elongate members (e.g., endpieces 108a, 108b, 108d, 108e) attached to or formed integrally with an upper or lower surface of the planar cover 108. Alternate examples include the use of such or other members Within the cover 108 itself. These internal members can also be used to control air flow in 124.

As above, the dimensions and configuration of further structural members 108c, as well as the materials out of they are fabricated and integrated into cover 108, are selected to regulate shock and vibration in accord with the characteristics of the cover, the board (e.g., substrate 102 and/or cold plate 114) and the expected operation environment of the assembly 100. In the illustrated embodiment, such selection is performed empirically, while in other embodiments it is performed using computer aided design modelling programs, or otherwise.

Circuit Board Assembly for use in a Central Inlet Chassis Configuration

A circuit board assembly of the type discussed above can be mounted in a cabinet along with one or more other circuit board assemblies, in the manner shown in FIG. 2A. That drawing shows six such assemblies: three 202, 204, 206 in upper chassis slots and three 203, 205, 207 in lower chassis slots. Each of the assemblies 202–207 is constructed in the manner of assembly 100—though they do not all necessarily include the same circuit components 104 nor carry out the same digital data processing functions. Thus, for example, the assemblies include circuit boards (e.g., substrates and cold plates, if any) with integrated plenums 116 and/or 124 on which components are mounted. Examples of these are denoted as 203a (board and components) and 203b (cover forming plenum 124), the latter of which is shown in partial transparency for convenience. In addition, each assembly includes a panel for mechanical and electromagnetic interference (EMI) protection post-insertion. An example of this is denoted as 203c.

The assemblies are mounted in a cabinet, only air inlet grill 208 and electrical connector arrays 210, 212, 214 of which are shown. A more complete illustration of a preferred cabinet is provided in FIG. 5, et seq. and described below in the accompanying text. Referring back to FIG. 2A, in a preferred embodiment, the grill 208 forms part of the front cover of the cabinet and is generally disposed centrally between the upper assemblies 202, 204, 206 and the lower assemblies 203, 205, 207, in the manner indicated in the drawing. This central location, e.g., between assemblies 202 and 203, allows flow 216 to enter plenums 124 (and 116) of both assemblies 202, 203, concurrently in the common chassis in which they are disposed. Though such a configuration facilitates drawing air from the ambient environment for distribution to, and cooling of, the assemblies, the grill 208 can be positioned elsewhere—preferably so long as cooling air is available to be drawn over the air flow impedance-matched (or -relationally sized) assemblies, e.g., as illustrated with respect to assemblies 202, 203 by flow arrows 216. And, though a regular aperture pattern is shown for grill 208, an irregular pattern may be used as well, e.g., in order to achieve desired air how shaping or impedances, as can be determined empirically, through use of a computer aided design modelling programs, or otherwise.

According to a preferred practice of the invention, the assemblies 202–207 are each fabricated for insertion and operational coupling (e.g., electrical, optical and/or mechanical coupling such as alignment pins) in either the upper or lower chassis slots or a chassis having centrally disposed air inlet grill 208. Thus, though shown in an upper slot, assembly 202 can be rotated 180° and inserted for operation in a lower slot, as well. Conversely, though shown in a lower slot, assembly 203 call be rotated 180° and inserted for operation in an upper slot.

This is achieved in some embodiments, by sizing and/or arranging each assembly's respective parts (e.g., cover, substrate, component, flow-diverting elements, etc.) so that the assembly presents substantially like impedances and air flow patterns (e.g., within plenum 124) regardless of which edge of the assembly (e.g., top edge or bottom edge shown in FIG. 2A) serves as an inlet or outlet for cooling air within the chassis, and so that the assemnbly achieves the necessary electrical and mechanical coupling regardless of whether it is inserted in an upper or lower slot.

The assemblies of the illustrated embodiment do not present such symmetry of impedances and air flow patterns (e.g., on account of asymmetry of flow-diverting element or other part placement within each assembly). These assemblies 202–207 require that cooling air flow be received along one edge (e.g., bottom edge of assemblies 202, 204, 206 and top edge of assemblies 203, 205, 207). In such an embodiment, the flexibility to insert any given assembly, e.g., 202, in either an upper or lower chassis slot is achieved by inverting the connector sockets (not shown) in the chassis connector array 210. Thus, for example, if the connectors sockets 202d, 202c for circuit board assemblies in the upper slots are oriented with specific pins on the bottom, the corresponding sockets 203d, 203e for assemblies in the lower slots are oriented with those same pins on lop. Thus, regardless of which slot an assembly, e.g., 202, is inserted, its connectors can necessarily be oriented to mate with the socket(s) for that slot. Other embodiments could, for example use pairs of connectors on each assembly, with one member of each pair going active depending on which slot (upper or lower) the assembly is inserted into.

Central Inlet Circuit Board Assembly

Figure 2B:
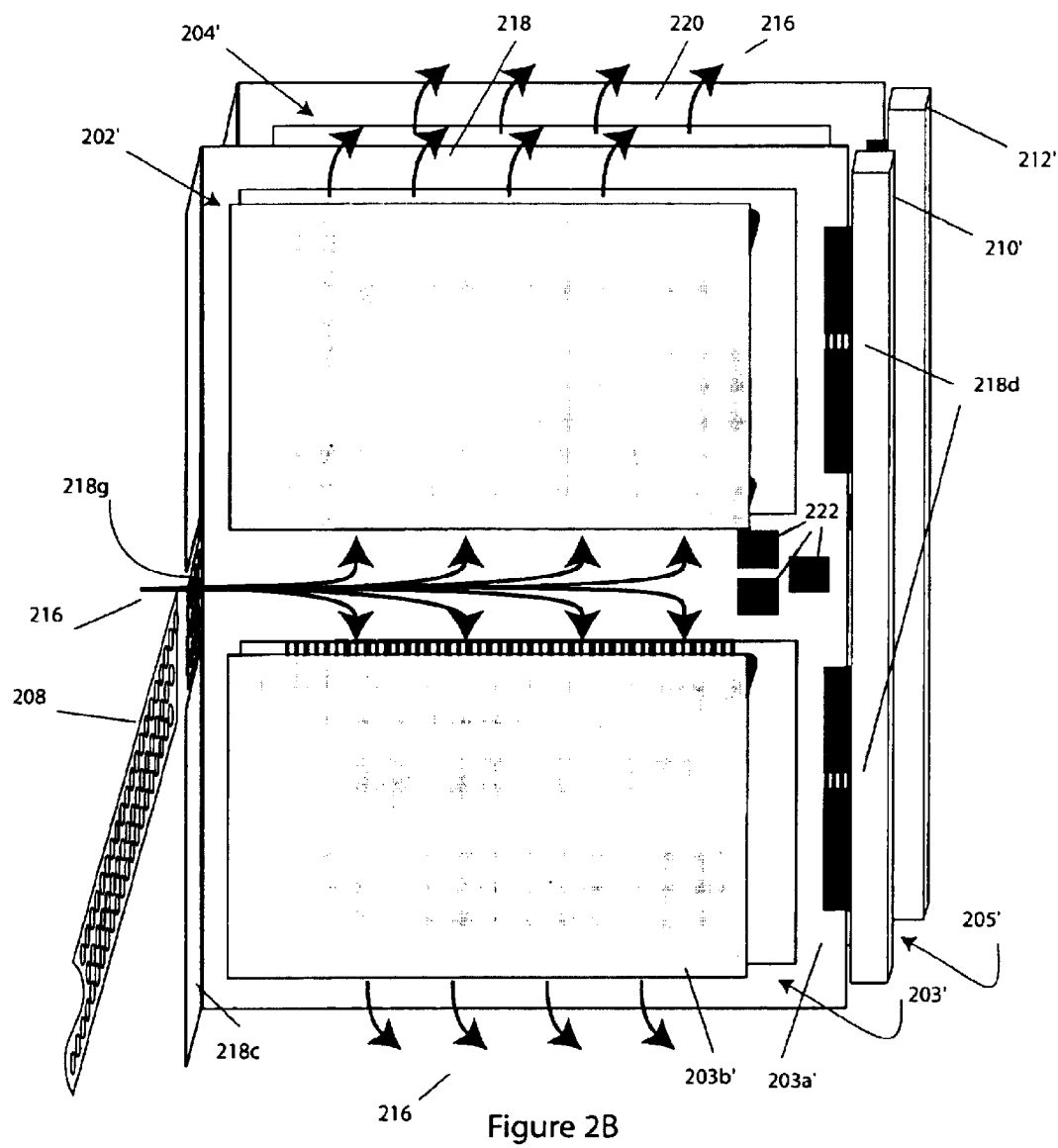
FIG. 2B depicts a center inlet circuit board assembly according to the invention.

FIG. 2B depicts an alternate configuration of a circuit board assembly of the type discussed above. That drawing shows four such assemblies, here, identified as 202', 203', 204' 205'. These are constructed and operated to like-numbered (sans primes) elements 202–205 of FIG. 2A, except as noted below. Thus, for example, as above each of the assemblies 202'–205' is constructed in the manner of assembly 100—though they do not all necessarily include the same circuit components 104 nor carry out the same digital data processing functions. And, as above, the assemblies include circuit boards (e.g., substrates and/or cold plates) on which components are mounted and covers.

Unlike the configuration of FIG. 2A, the assemblies are mounted or otherwise formed in pairs 202', 203' and 204', 205'—or larger groupings—on boards 218, 220, respectively, as shown. These boards 218, 220 are well suited for large format factors such as the IEEE 1101 or Eurocard 9U standards, or other standard or non-standard large-form form factors, and, accordingly, labelled below as "large format" assemblies. Those skilled in the art will, of course, appreciate that the teachings with respect thereto can be equally applied to smaller format factors, such as IEEE or Eurocard 6U standards, or other standard or non-standard smaller-form form factors, and below and, hence, that the label selected is merely for convenience and not to be treated as limiting.

As above, in the illustrated embodiment, the large format assemblies 218, 220 are mounted in a covered chassis or cabinet (not shown), only air flow inlet grill 208 and electrical connector arrays 210', 212' of which are shown. Grill 208 is positioned and functions identically as discussed above and is labelled the same accordingly. Connectors arrays 210', 212' are likewise constructed and operated identically to arrays 210, 212 discussed, albeit in the illustrated embodiment arrays 210 need not (but can) accommodate assemblies (or boards) that can be "flipped over" in the manner of assemblies 202–207, discussed above. A more complete illustration of a preferred chassis is provided in FIGS. 3, et seq. and 5, et seq. and described below in the accompanying text.

Rather than providing a panel, e.g., 203c, for mechanical and electromagnetic interference (EMI) protection on each sub-assembly 202'–205', a single such panel is provided for the each entire large format assembly 218, 220. An example of this is denoted as 218c. Such a panel 218c can include an integral grill portion 218g mounted adjacent to, for example, and grill 218 provided for the cabinet as a whole and serving the same purpose as that grill 208. Thus, the integral grill portion 218g is generally disposed centrally between the sub-assemblies pairs 202', 203' and 204', 205' that make up each large format assembly and is generally aligned with the chassis air flow inlet grill 208 through which airflow 216 enters. As above, though such a configuration facilitates drawing air from the ambient environment for distribution to, and cooling of, the sub-assemblies, the grill portion 218g can be positioned elsewhere.

In some embodiments, the subassembly pairs 202', 203' and 204', 205' are formed independently of—and, thereafter, mounted—to the respective large format assemblies 218. 220, respectively. Preferably, however, the pairs are at least, in part, integral to the respective large format assemblies. Thus, for example, sub-assemblies 202', 203' share a common substrate and/or cold plate with the large format assembly 218. Regardless, the larger format assembly can include circuit components, e.g., 222, and other elements separate from those provided on the respective assembly pairs.

Although in some embodiments, each sub-assembly 202'–205' includes a connector for attachment to the respective connector array 210' (subassemblies 202'–203') and 212' (sub-assemblies 204'–205'), in the illustrated embodiment, a single set of connectors are provided for each large format assembly. One such set is denoted as 218d. Though that illustrated set has two elements, greater or fewer elements set may be provided—which elements may (but need not) correspond to the assemblies that make up the respective large format assembly 218.

Card-Cage with Integrated Control and Shaping of Flow Resistance Curve for Multiple Plenum Chambers A "card cage" or other portion of a chassis for mounting circuit board assemblies 202–207 can be fabricated in any manner or configuration known in the art. One such cage 302, of the type fashioned from sheet metal members, extrusions, mill products, or other elongate members 304, brazed, screwed or otherwise fixed into a frame-like structures is shown in FIG. 3A. Cages of this type are characterized by open spaces 306 between inserted assemblies, e.g., 202, 204, through which air may flow—as indicated by flow arrows 308a, 308b. Other card cage assemblies or chassis arrangements of this or other types known in the art may be used as well or instead. These cages can be used in an open rack configurational or, preferably, as part of a covered chassis or cabinet, for example, as shown in FIGS.

5A–5B, with one (or more) cage(s) positioned in an upper portion of the chassis (i.e., forming upper board slots) and one (or more) other cage(s) positioned in a lower portion (i.e., forming lower board slots). Those skilled in the art will appreciate that the cages can be fabricated integral to such chassis or fabricated separately.

In a preferred embodiment, a card cage 310 as shown in FIG. 3B is used. Unlike the cage 302, cage 310 has integrated features, such as the surfaces and apertures discussed below, that permit air flow only through inserted circuit board assemblies 202–207 and, more particularly, through any plenum (e.g., 124) defined between the cover and board of each respective assembly and any plenum (e.g., 116) in a cold plate on which the board is disposed or formed. More generally, those features provide for control and shaping of flow resistance of the assemblies 202–207 mounted therein. This is likewise true if used with prior art circuit boards insofar as the 310 cage limits air flows entering and exiting at the edges of those boards and, more generally, within the cage as a whole; though a more full benefit of the card cage 310 is attained when used with assemblies such as 202–207.

Referring to FIGS. 3B and 3C, cage 310 has surfaces 312, 314 with guides 316 for the circuit board assemblies and/or circuit boards. The guides 316 comprise channels of U-shaped cross-section (though other shapes may be used instead) in which the assemblies 202–207, 218, 220 are slidably received. Apertures 318 are disposed in surface 312 of the channels above the locations where the upper edges of the respective assemblies and/or boards will reside upon insertion in the slots. Such apertures 318 are likewise disposed in surface 314 of the channels and below the locations of the lower edges of the inserted assemblies and/or boards. FIG. 3C is a plan view of the underside of surface 314. Apertures 318 are visible from this perspective, though (of course) guides 316 are not. Also visible are the bottom edges of the cage sides 320 (if any) in the vicinity of surface 314 and the plenum 322 (if any) formed thereby beneath that surface.

In the illustrated embodiment, the apertures 318 are sized to present equal impedances to air flow entering and exiting the card cage 310 and to pass like volumes of air to each inserted assembly or board. In alternate embodiments, the impedances of the respective slots are adjusted in accord with requirements of the assemblies/boards that will reside in the slots, e.g., in accord with principles discussed above in connection with varying the impedances presented by the assemblies 100 themselves to air flows. Apertures that are or will be occupied by no assembly or board are covered. Apertures could be of different physical size without impacting the ability to adjust their impedance.

Illustrated cage 310 includes a left-side structural member 323 providing spacing and support for surfaces 312 and the sides 320 that support them. A corresponding right-side structural member (not shown) can be provided as well, e.g., in configurations where the cage 310 is fabricated as a module separate from any chassis in which it may be embodied. In some embodiments of the invention, structural members 323 and/or sides 320 are not used. Instead, the surfaces 312, 314 are fabricated integral to the chassis and/or fabricated separately and affixed thereto.

Referring to FIG. 3D, in operation of a digital data processing or other apparatus utilizing cage 310, cooling air drawn in from the ambient environment (e.g., via grill 208) or otherwise, passes through slots in surface 314, through the assemblies plenums (or around the boards, in case of boards without plenums), and exits through slots in surface 312. That exit may be to the environment outside the chassis or, for example, merely to another region within the cabinet e.g., a plenum leading to fans or other air movers for the cabinet. Those skilled in the art will, of course, appreciate that the flow of cooling air could be reversed without deviation from the spirit of the illustrated embodiment or of the invention.

According to a preferred practice of the invention, cage 310 is manufactured by dip brazing or vacuum brazing of aluminum, or other metals or composites (with corresponding manufacturing techniques being applied to such other metals or composites), so as to ensure an air tight junction between the surfaces 312, 314, guides 316 and any sides 320 so the majority of available air flows through apertures 318. More generally, it insures that available air flow into the card cage is evenly or, otherwise predictably distributed through the circuit board assemblies in accord with their respective air-flow impedances. Dip or vacuum brazing also contributes to the structural integrity of the cages, e.g., for protection against damage from shock or vibration , and facilitates EMC control.

Those skilled in the art will appreciate that the air- and electromagnetic interference-tight seal of dip or vacuum brazing can be achieved by other techniques, as well. Thus, for example, surfaces 312, 314, guides 316 and any sides 320 may be affixed to one another via welding, soldering, epoxies, or other adhesives. They may, as well, be bolted or otherwise affixed together, e.g., so long as a sealed plenum chamber is achieved. Moreover, the cage 310 can be milled from block. Plastics or other materials (composites, laminates or otherwise) may be used instead of metals, e.g., to the extent that their fabrication insures air-tightness and/or even or otherwise predictable air flow distribution and to the extent that they provide the requisite structural integrity and EMC control.

Figure 5A:
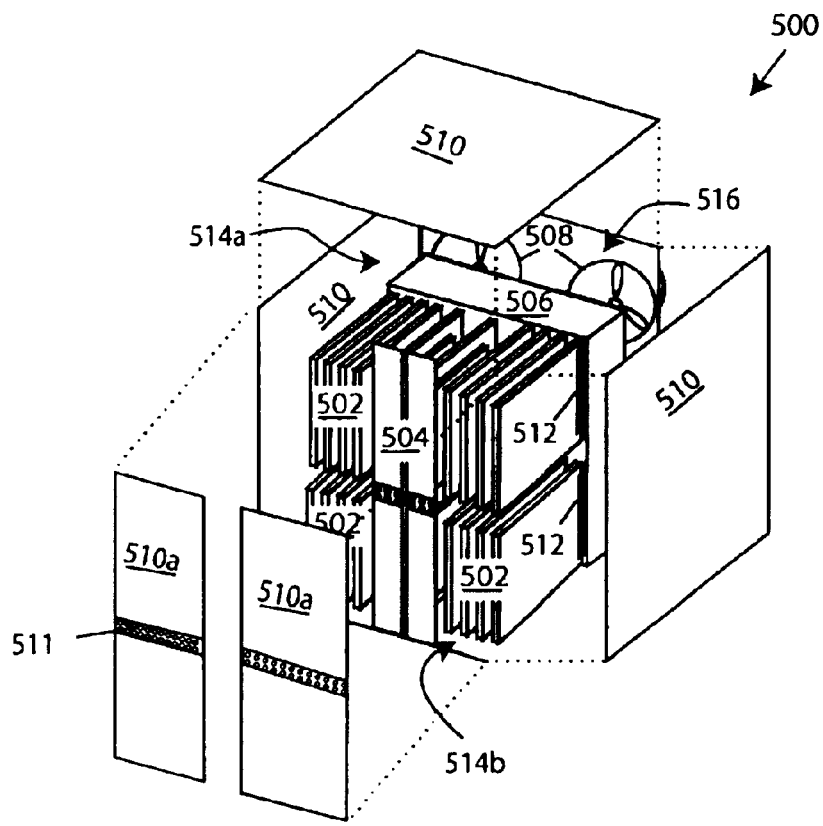
FIGS. 5A–5B depicts an air-cooled digital data processor according to the invention capable of operating with high inlet temperatures and high levels of shock and vibration.
Figure 5B:
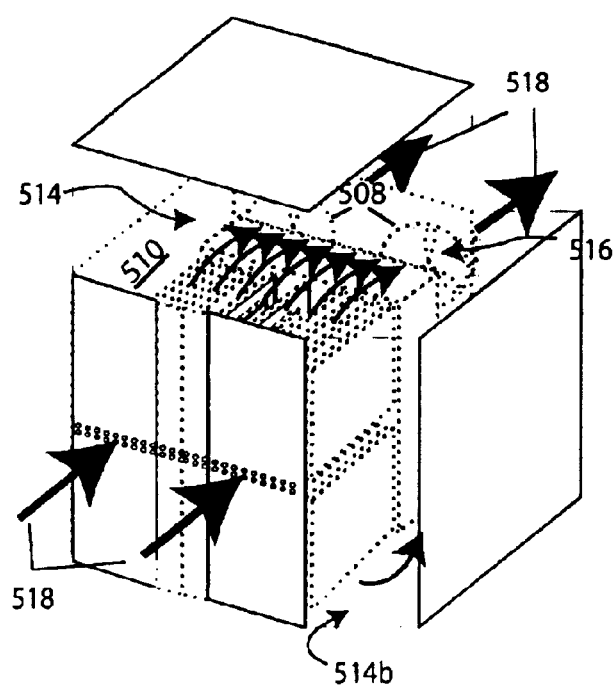

As above, card cage 310 can be used in an open rack configuration or, preferably, as pan of a covered chassis, for example, as shown in FIGS. 5A–5B, with one (or more) cage(s) positioned in an upper portion of the chassis (i.e., forming upper board slots) and another positioned in a lower portion (i.e., forming lower board slots). Though in the embodiments of FIGS. 3B–3D cape 310 is fabricated separately from a covered chassis in which it is used, it can be fabricated integral to the chassis, as well.

Figure 3E:
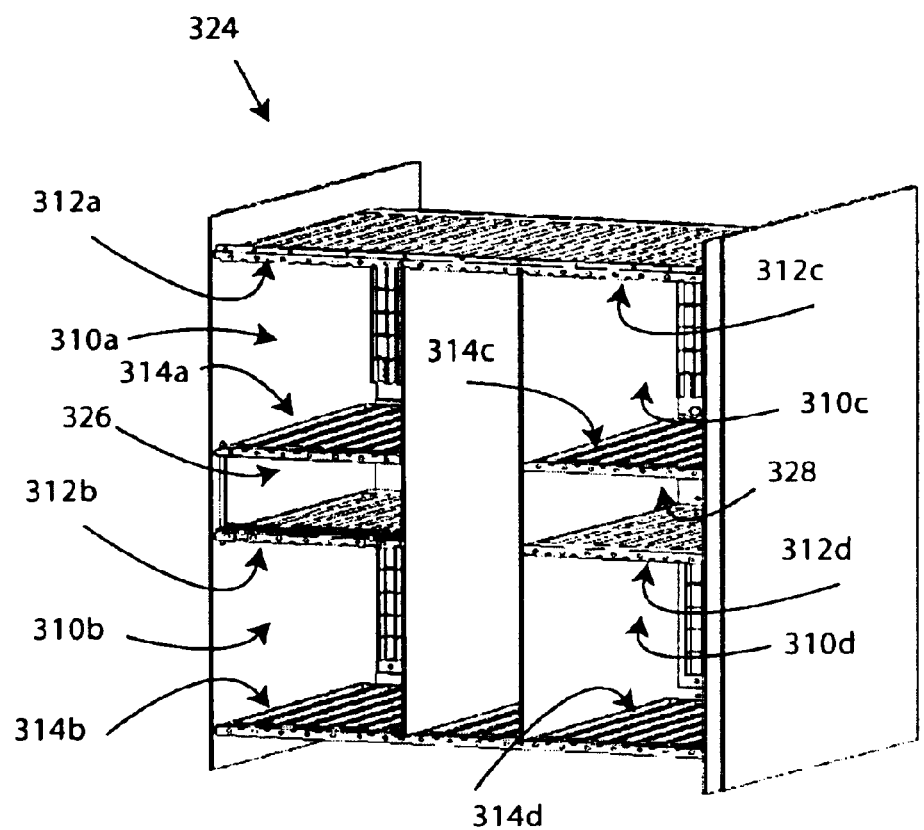
FIG. 3E depicts a chassis according to the invention comprising a plurality of card cages of the type depicted in FIGS. 3A–3D.

Such a configuration is shown in FIG. 3E, where cages 310a–310d are formed integral to a chassis 324, as shown. Each cage includes portions that correspond to surfaces 312 and 314 and that are labelled according, to wit, as 312a, 314a, 312b, 314b, and so forth. The cages are positioned so that upper and lower cages 310a, 310b are separated by a region 326 corresponding to the position of grill 208 on doors, covers or panels (not shown) placed on the front of the chassis 324. Upper and lower cages 310c, 310d are separated by a like region 328. Moreover, the pairs of cages 310a, 310b and 310c, 310d—which will hold assemblies 202, 203 and 204, 205, respectively, are separated by a region that will hold large format assemblies, such as 218, 220.

The chassis 324 is fabricated from elongate members and panels of aluminum or other metal, positioned and tacked in a configuration as shown. Per a conventional vacuum brazing process, a braze alloy is applied to the members, which are then treated in a vacuum furnace. Alternatively, the elongate members and panels are joined and brazed in accord with a conventional dip brazing process. Of course, where metals, composites or other materials are used that are not amenable to brazing, appropriate corresponding manufacturing techniques are employed.

Circuit Board Assembly Installation and Sealing into the Air Plenum Chamber of a Card-Cage Assemblies 202–207 and large format assemblies 218, 220 can be sealed and maintained within the card cage 310, chassis 324 or other card cage or chassis structures using rubber, elastomers, nylon, wedge-locks and other conventional means known in the art. In a preferred embodiment, a seal is established to provide improved thermal, shock, vibration, and/or electromagnetic compatibility (EMC) control.

Figure 4A:
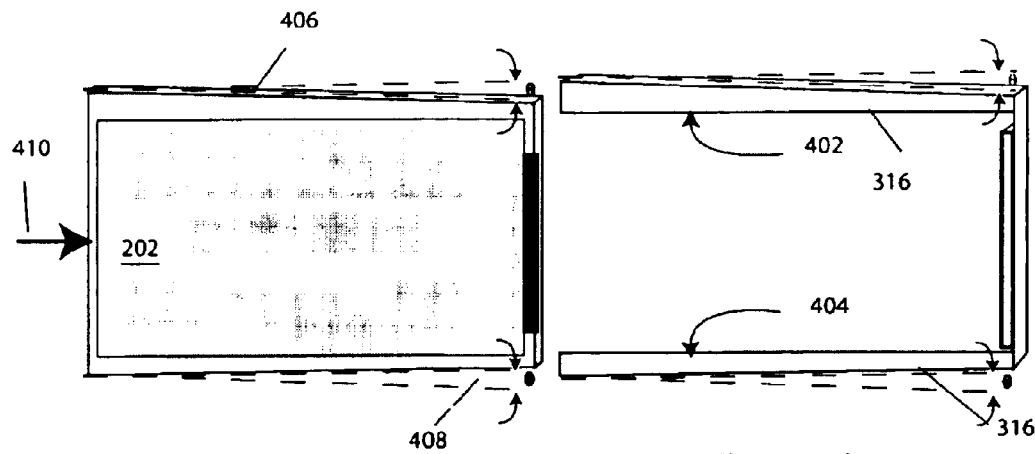
FIGS. 4A–4C depicts a card cage support and circuit board assembly according to the invention with improved air flow sealing.

To this end, referring to FIG. 4A, as noted above guides 316 comprise channels of U-shaped cross-section (though other shapes may be used instead) in which the assemblies 202–207, 218, 220 are slidably received. The inner dimensions of those channels are preferably sized in accord with the dimensions of the edges of circuit board assembly, e.g., 202, which they contact upon sliding insertion of the assembly into the cage 310. Of course, such sizing must take into account manufacturing tolerances, desired ease of insertion, expected thermal expansion, and so forth.

The assembly-contacting surfaces 402, 404 of guides 316 are metal, e.g., aluminum, brass, copper, or other metals, composites or compounds. At some points in the contact surface EMI gasketing may be used. In this regard, the guides can be fabricated entirely from such metal or they can be fabricated from a combination of other materials and provided with a coating or laminate (e.g., Teflon, nylon, etc.) on surfaces 402 or 404. Likewise, illustrated circuit board assembly 202 includes metal on surfaces 406, 408 that contact surfaces 402, 404, respectively. The surfaces 406. 408 can be formed integral smith any metal cold plate 114 included in the assembly 202 or they can comprise a metal sized layer or laminate added to an edge of the cold plate 114 and/or cover 108 and/or substrate 102 making up the assembly 202.

While the surfaces 402–408 can be fabricated at right angles to their neighboring edges (or, put another way, so that surfaces 402, 404 are parallel to one another and surfaces 406, 408 are parallel to one another), preferably, one or more of them is angled in pairs (i.e., 402 and 404 or 406 and 408) so as to ease at least initial sliding insertion of the assembly 202 into guide 316 and to insure tightness of fit upon final insertion. This is represented in the drawing by a slight canting of illustrated upper guide 316. This can be at any angle θ that achieves the foregoing, e.g., for example, between 5° and 10° and, more typically, between 2° and 4° for a conventional circuit board, as determined empirically and/or through use of a computer aided design modelling program.

In addition to, or instead of, canting guide 316, the spacing between the sides of its U-shaped (or other-shaped) channel can be varied and/or wedges, bumps or other perturbation incorporated therein, so as to provide the desired friction fit. Such canting, other dimensional variations or perturbations can be incorporated into surfaces 406, 408, instead or in addition. Regardless, according to one practice of the invention, the goal is to achieve an air-tight and/or EMC-tight seal effective from 50%–100% and, preferably, between 90–100%.

Figure 4B:
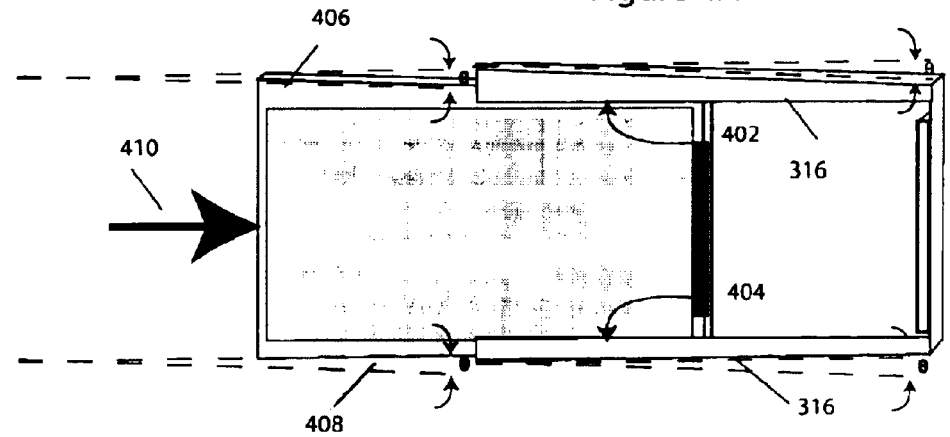
Figure 4C:
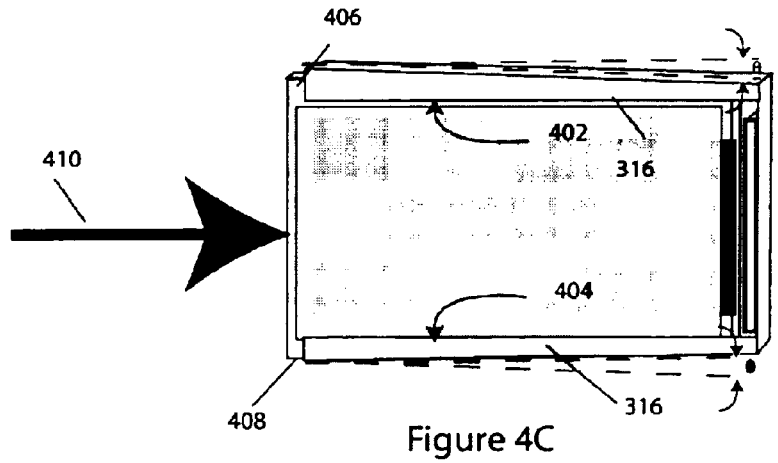

The resulting increasing force necessary to slide the assembly 202 into the guides 316—and corresponding increasing lightness of fit—is represented by the enlargened force arrow 410 shown in FIG. 4B and, then again, in FIG. 41C, to facilitate insertion or extraction, camed leavers or other board insertion/extraction mechanisms (not shown) can be employed.

Digital Data Processor Chassis with Flow Balanced Air Intake into Multiple Circuit Board Assemblies FIG. 5A is an exploded view of digital data processor 500 according to the invention utilizing a central flow-balanced air intake. The digital data processor includes circuit board assemblies 502 constructed in the manner of assembly 100 (though all not necessarily include the same circuit components 104 nor carrying out the same digital data processing functions), as well as center inlet circuit board assemblies 504 constructed in the manner of larger format assemblies 218 (again, all not necessarily including the same circuit components 104 nor carrying out the same digital data processing functions). The digital data processor may also include prior art circuit boards.

According to one practice of the invention, digital data processor is configured as a digital signal processor, with one or more assemblies 502, 504 or boards configured as mother-boards, coprocessors and/or for performing signal processing boards (e.g., for fast Fourier transforms or other signal processing functions). Those assemblies/boards may include onboard memory, though, one or more other assemblies/boards may be solely dedicated to memory or other storage functions. Still further assemblies/boards may be dedicated to input/output, fabric interconnects, or other desired functions.

The assemblies are disposed in a chassis (not shown) that holds them in position, e.g., during operation of the digital data processor 500. The chassis may include one or more card cages of any of the types described above or otherwise known in the art. Thus, for example, it may comprise a rack or open design of the type shown in FIG. 2A described in connection therewith. According to a preferred practice of the inventions, the chassis comprises one or more cages of the type described in connection with FIGS. 3B–3D. FIG. 5A assumes a chassis of the illustrated embodiment is of the type identified above as chassis 324, though it will be appreciated that chassis of other configurations and types may be used instead.

The components are surrounded by cabinet sides 510, here arranged in a cubic configuration of typically 4–5 cubic feet, though configurations of other shapes and volumes may be used a swell. One of the sides, 510a, includes or comprises a removable, rotatable or other panel facilitating access to the assemblies/boards 502, 504, e.g., for purposes of insertion and removal (e.g., via guides 316) and connection to (or disconnection from) electrical connector arrays 512 at the "back" of the chassis. Those arrays 512 are constructed and operated in the manner of electrical connector arrays 210, 212, 214, discussed above.

Air inlet grill 511 positioned and functioning in the manner of grill 208 is provided on side 510a, providing cooling air—typically of temperatures ranging up to 50°–55° C., though, extending up to 70° C.—from outside the cabinet to assemblies 502 and boards 504. In the illustrated embodiment, the grill is positioned substantially at the center of the side 510a, as illustrated. More generally, the grill disposed centrally between the assemblies 502 in upper card cage or chassis slots and those in lower card cage or chassis and/or assemblies that make up the respective large format assemblies 504, in the manner indicated in the drawing. Though such a configuration facilitates drawing air from the ambient environment for distribution to, and cooling of, the assemblies, the grill 208 can be positioned elsewhere—preferably, so long as cooling air is available to be drawn over the flow impedance-matched (or -relationally sized) assemblies. Note that reversing the flow is possible while retaining the described benefits.

In addition to chassis, and assemblies/boards 502, 504, the digital data processor includes power subsystem 506 of the conventional type known and sized in accord with the power requirements of the other components. Illustrated subsystem 506 can accommodate 3000–6000 W (e.g., with up to 1500 watts/foot³ for enclosed digital data processor 500 as a whole, and with up to 3000 watts/foot³ per card cage or sub-chassis), though other embodiments may accommodate lesser and greater wattages. The subsystem is positioned "behind" the assemblies/boards and chassis, as shown, so as to leave a plenum 514a above (and a similar plenum 514b below) and plenum 516 behind for air flow exiting the assemblies/boards. Those skilled in the art will appreciate that the subsystem 506 can be disposed elsewhere, even outside the enclosure, so long as there is a pathway for the exiting air flow.

Also included in digital data processor 500 are fans 508. Referring to FIG. 5B, these are conventional fans of the type known in the art sized to pull the requisite volume of cooling air flow 518 through grill 511, assemblies/boards 502, 504, and plenums 514, 516 and back out of the cabinet. Illustrated fans move a combined total of up to 1.000 cubic feet of air per minute (features that represent an upper end of present air mover technology), though tans of lesser and greater capacity may be used as well. Though illustrated fans 508 are shown at the back of the cabinet, they can be positioned elsewhere (e.g., on racks external to the digital data processor 500, with ducts leading to/from its enclosed chassis) that defines a pathway for cooling airflow through the assemblies/boards 502, 504. Moreover, while illustrated fans are positioned to pull air through the digital data processor, in alternate embodiments, they may be positioned to push air flow instead, or in addition. In alternate embodiments, the fans could be placed in the front of tile chassis rather than the rear.

Described above are circuit board assemblies, card cages, chassis, cabinets, digital data processors and methods of fabrication and operation thereof meeting the aforementioned objects. These provide for improved capacity, density, efficiency, ruggedness, and/or longevity of components that provide digital data processing functions. They can be used with air-cooling and more particularly, for example, forced air-cooling—as well as with other heat dissipation techniques. Moreover, they can be implemented at low cost using existing components, materials and/or fabrication techniques.

It will be appreciated that the embodiments shown and described here are merely examples of the invention and that other embodiments incorporating changes therein fall within the scope of the invention. By way of non-limiting example, it still be appreciated that the spring-mounted (or other resiliently-mounted) heat sinks shown, for example, in FIG. 1 may be disposed for contact with the substrate and/or a cold plate to which the substrate is mounted (or of which it is formed) instead of, or in addition to, circuit components. By way of further non-limiting example, it will he appreciated that, although the circuit board and circuit board assemblies described above are shown (and described) with circuit components (e.g., 104) and covers (e.g., 108) on only one side of the substrate, such components and/or covers may be provided on both sides of the substrate consistent with the teachings herein. In view of the foregoing.

What we claim is:

1. A circuit board assembly comprising a circuit board comprising a substrate and one or more circuit components thereon, a cover coupled to the circuit board and disposed adjacent to the substrate so as to define a plenum in which one or more of said components are disposed and through which air flows to cool at least one of those components, said plenum having at least a first edge, for intake of that air flow, disposed between the cover and the substrate at a first edge of at least one of the cover and the substrate, said plenum having at least a second edge, for exit of that air flow, disposed between the cover and the substrate at a second edge of at least one of the cover and the substrate, the cover comprising
a planar member and
one or more structural elements coupled to the planar member that regulate any of shock and vibration in any of the cover and the circuit board.

2. The circuit board assembly of claim 1, wherein one or more of the structural elements are formed integrally with the planar member.

3. The circuit board assembly of claim 2, wherein the one or more of the structural elements disposed on a surface of the planar member.

4. The circuit board assembly of claim 1, wherein one or more of the structural elements comprise an elongate member.

5. The circuit board assembly of claim 1, wherein one or more of the structural elements comprise a rod-like member.

6. The circuit board assembly of claim 5, wherein one or more of the structural elements are disposed at one or more ends of the planar member.

7. The circuit board assembly of claim 5, wherein one or more of the structural elements comprise a cross-shaped member.

8. The circuit board assembly of claim 1, wherein one or more of the structural elements comprise a heat-dissipative element.

9. The circuit board assembly of claim 1, wherein one or more of the structural elements are arranged to control electromagnetic emissions.

10. The circuit board assembly of claim 7, wherein one or more heat dissipative elements are mounted by one or more springs or other resilient elements (collectively, "springs") to the planar member and in thermal contact with one or more of the circuit components.

11. A cover for use with a circuit board, the cover comprising a planar member that is mounted adjacent to the circuit board so as to define a plenum in which one or more circuit components are disposed and through which air flows to cool at least one of those components, said plenum having at least a first edge, for intake of that air flow, disposed between the circuit board and the planar member at a first edge of at least one of the circuit board and the planar member, said plenum having at least a second edge, for exit of that air flow, disposed between the circuit board and the planar member at a second edge of at least one of the circuit board and the planar member, and one or more structural elements coupled to the elongate member that regulate shock and vibration in any of the cover and the circuit board.

12. The cover of claim 11, wherein one or more of the structural members comprise an elongate member, a rod-like member, a cross-shaped member and heat-dissipative element.

13. The cover of claim 12, wherein the structural members are disposed on the surface of the planar member.

14. The cover of claim 12, wherein one or more of the structural members are disposed at one or more ends of the planar member.

15. The cover of claim 12, wherein the cover is adapted to be removably affixed to the circuit board.

16. The cover of claim 12, wherein the planar member is thermally conductive.

17. The cover of claim 12, wherein the planar member comprises a cold plate.

18. The circuit board assembly of claim 11, wherein one or more of the structural elements are arranged to control electromagnetic emissions.

\* \* \* \* \*

UNITED STATES PATENT AND TRADEMARK OFFICE
CERTIFICATE OF CORRECTION

PATENT NO. : 6,759,588 B1
DATED : July 6, 2004
INVENTOR(S) : Randall G. Banton et al.

It is certified that error appears in the above-identified patent and that said Letters Patent is hereby corrected as shown below:

<u>Title page</u>,
Item [57], ABSTRACT,
Line 30, following "manufactured by an alternate process", please delete "welding" and insert -- yielding --.

Signed and Sealed this

Seventh Day of December, 2004

JON W. DUDAS
*Director of the United States Patent and Trademark Office*